United States Patent [19]

Plachno

[11] 4,379,974
[45] Apr. 12, 1983

[54] DELAY STAGE FOR A CLOCK GENERATOR

[75] Inventor: Robert S. Plachno, Lewisville, Tex.

[73] Assignee: Mostek Corporation, Carrollton, Tex.

[21] Appl. No.: 261,121

[22] PCT Filed: Sep. 10, 1980

[86] PCT No.: PCT/US80/01163
§ 371 Date: Sep. 10, 1980
§ 102(e) Date: Sep. 10, 1980

[87] PCT Pub. No.: WO82/00930
PCT Pub. Date: Mar. 18, 1982

[51] Int. Cl.³ .................. H03K 5/135; H03K 3/295; H03K 3/356; H03K 17/284
[52] U.S. Cl. ...................... 307/269; 307/279; 307/290; 307/578; 307/593; 307/594; 307/597; 307/601; 307/605
[58] Field of Search ............ 307/262, 269, 279, 290, 307/481, 482, 594, 595, 597, 578, 601–603, 605, 608, 593

[56] References Cited

U.S. PATENT DOCUMENTS 3,898,479 8/1975 Proebsting ............... 307/482
3,984,703 10/1976 Jorgensen ............. 307/451 X
4,001,722 1/1977 Patel et al. .................. 331/111
4,061,933 12/1977 Schroeder et al. ........... 307/269 X
4,090,096 5/1978 Nagami ..................... 307/482 X
4,122,361 10/1978 Clemen et al. .............. 307/482 X
4,242,604 12/1980 Smith ....................... 307/290 X
4,250,408 2/1981 Spence .................... 307/269 X

FOREIGN PATENT DOCUMENTS 54-144833 12/1979 Japan ..................... 307/279

OTHER PUBLICATIONS

Yamaga et al., "Industrial Use C² MOS IC", *Toshiba Review*, No. 95, pp. 20-25; 2/75.

Primary Examiner—Larry N. Anagnos

[57] ABSTRACT

A delay stage (30,50) receives input signals at input terminal (16) and power from power terminals (12, 14). A detector circuit (30) is connected between power terminals (12, 14) and to the input terminal (16) for receiving the input signal and for generating a detection signal upon detecting a predetermined level of the input signal. A buffer circuit (50) is connected between the power terminals (12, 14) and to the detector circuit (30) for receiving the detection signal while not capacitively loading the detector circuit (30).

25 Claims, 3 Drawing Figures

DELAY STAGE FOR A CLOCK GENERATOR

TECHNICAL FIELD

This invention relates to MOS integrated circuits, and more particularly relates to a clock generator and delay stage utilizing a Schmitt trigger release with a push-pull buffered output.

BACKGROUND ART

In the design of digital logic circuits, large scale integration techniques have brought about the construction of large numbers of components being fabricated on a single chip of silicon. In such circuitry, utilizing metal-oxide-semiconductor MOS techniques, random access memory devices have been fabricated. Such memories as well as other semiconductor circuitry utilize numerous clock signals generated by clock generators.

Clock generators for use with semiconductor data processing circuits are shown in U.S. Pat. No. 3,898,479 issued to Proebsting on Aug. 5, 1975 and entitled "Low Power, High Speed, High Output Voltage FET Delay-Inverter Stage" and U.S. Pat. No. 4,061,933 issued to Schroeder et al. on Dec. 6, 1977 and entitled "Clock Generator and Delay Stage". Such previous developed clock generators utilize a precharge input clock which necessitates an additional input to the clock generator circuit resulting in increased complexity as well as decreased performance and versatility.

With improved fabrication techniques, integrated circuits are made smaller in geometry of size; however, as the size of such circuits becomes smaller, the associate capacitance between circuit components does not similarly decrease. Overlap capacitance or Miller capacitance of transistor devices in such integrated circuits creates a substantial problem in affecting the response time of clock generators. The response time, in turn, determines, in part, how pattern insensitive the clock generator becomes to a quickly changing input voltage. Previously developed clock generators suffer in that with reduced geometries, Miller capacitance prevents the operation of such clock generators at desirable response times to operate independent of input voltage patterns. Furthermore, clock generators must operate independent of the rise time or slew rate of the input voltage signal.

A need has thus arisen for a clock generator for use in semiconductor circuitry which does not require a precharge input clock. Further, a need has arisen for a clock generator that operates independent of and is insensitive to input slew rates and input voltage patterns. Additionally, a need has arisen for a clock generator that has improved response times and fast reset times.

DISCLOSURE OF THE INVENTION

In accordance with the present invention, a clock generator is provided for random logic applications using MOS technology to substantially eliminate the problems heretofore associated with clock generators and which offers the advantages of insensitivity to input slew rates and voltage patterns without the need for a precharge input clock.

In accordance with the present invention, a delay stage for a clock generator circuit for providing clocking signals and which receives an input signal at an input terminal, produces an output signal at an output terminal and is powered through first and second power terminals is provided. A detector circuit is connected between the first and second power terminals and is connected to the input terminal for receiving the input signal. The detector circuit generates a detection signal upon detecting a predetermined level of the input signal. A buffer circuit is connected between the first power terminal and the detection circuit for receiving the detection signal and for generating the output signal at the output terminal.

In accordance with another aspect of the present invention, a clock generator circuit for producing clocking signals and which receives an input signal at an input terminal, produces an output signal at an output terminal and is powered through first and second power terminals is provided. First, second and third transistors, each having drain, source and gate terminals are connected in series between the first power terminal and the second power terminal. A first node is formed between the first and second transistors, and a second node is formed between the second and third transistors. A fourth transistor having drain, source and gate terminals is connected between the first power terminal and the second node. The gate terminal of the fourth transistor is connected to the first node. Fifth and sixth transistors are further provided, each having drain, source and gate terminals. The fifth and sixth transistors are connected in series between the first power terminal and the second node. The fifth and sixth transistors form a third node therebetween forming the output terminal. The gate terminal of the fifth transistor is connected to the first node. The gate terminal of the second transistor, the gate terminal of the third transistor and the gate terminal of the sixth transistor are connected to the input terminal.

In accordance with yet another aspect of the present invention, a clock generator circuit for providing clocking signals and which receives an input signal at an input terminal and which is powered through first and second power terminals is provided. A first transistor having drain, source and gate terminals is provided wherein the drain terminal is connected to the first power terminal. The circuit includes a second transistor having drain, source and gate terminals wherein the drain terminal is connected to the source terminal and gate terminal of the first transistor thereby forming a first node. The gate terminal of the second transistor is connected to the input terminal. A third transistor having drain, source and gate terminals is provided in the clock generator. The drain terminal of the third transistor is connected to the source terminal of the second transistor thereby forming a second node. The gate terminal of the third transistor is connected to the input terminal and the source terminal thereof is connected to the second power terminal. A fourth transistor is provided having drain, source and gate terminals. The drain terminal of the fourth transistor is connected to the first power terminal, the gate terminal thereof is connected to the first node, and the source terminal thereof is connected to the second node. A fifth transistor is further provided having drain, source and gate terminals. The drain terminal of the fifth transistor is connected to the first power terminal and the gate terminal thereof is connected to the first node. A sixth transistor having drain, source and gate terminals is provided. The drain terminal of the sixth transistor is connected to the source terminal of the fifth transistor, the gate terminal thereof is connected to the input terminal and the source terminal of the sixth transistor is connected to the second node.

BRIEF DESCRIPTION OF DRAWINGS

For a more complete understanding of the present invention and the advantages thereof, reference will now be had to the following Detailed Description taken in conjunction with the accompanying Drawings in which.

DETAILED DESCRIPTION

Figure 1:
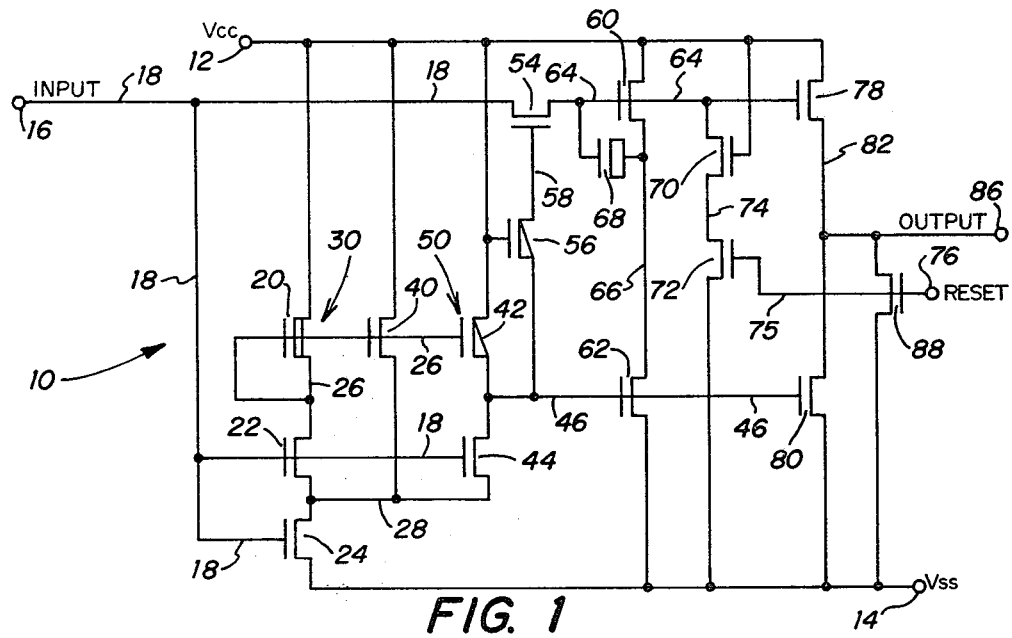
FIG. 1 is a schematic circuit diagram of the clock generator of the present invention.

Referring to FIG. 1, the clock generator of the present invention is illustrated and is generally identified by the numeral 10. Clock generator 10 is supplied with power through a power supply terminal 12 and a power supply terminal 14. Power supply terminal 12 is designated as $V_{cc}$ and is typically, for example, 5.0 volts. Power terminal 14 is designated as $V_{ss}$ and is typically, for example, 0.0 volts. Input signals are applied to clock generator 10 via an input terminal 16 to a node 18.

Interconnected in series between power terminal 12 and power terminal 14 are transistors 20, 22 and 24. The drain terminal of transistor 20 is connected to power terminal 12. The gate and source terminals of transistor 20 are interconnected to form a node 26. Node 26 is interconnected to the drain of transistor 22. The gate of transistor 22 is interconnected to node 18 to receive the input to clock generator 10. The source of transistor 22 and drain of transistor 24 are interconnected to form a node 28. The gate of transistor 24 is interconnected to node 18. The source of transistor 24 is interconnected to power terminal 14. Node 26 is interconnected to the gate of a transistor 40. The drain of transistor 40 is interconnected to power terminal 12, and the source of transistor 40 is interconnected to node 28.

Transistors 20, 22, 24 and 40 comprise a Schmitt trigger generally identified by the numeral 30 which functions as a level detector to detect changes in the level of the input to clock generator 10. Transistor 20 may comprise, for example, as shown, a depletion type MOSFET wherein $V_T$ is minus three volts or alternatively, a saturated enhancement type MOSFET in which case the gate thereof is connected to power terminal 12. Transistors 22, 24 and 40 may comprise, for example, an enhancement MOSFET wherein $V_T$ is one volt.

Connected in series between power terminal 12 and node 28 are transistors 42 and 44. The drain of transistor 42 is connected to power terminal 12 and the gate thereof is connected to node 26. The source terminal of transistor 42 is interconnected to the drain terminal of transistor 44 thereby forming a node 46. The gate terminal of transistor 44 is interconnected to node 18 to receive the input signal to clock generator 10. The source terminal of transistor 44 is interconnected to node 28.

Transistors 42 and 44 comprise a push-pull buffer circuit generally, identified by the numeral 50, for receiving the output of Schmitt trigger 30 for application to the remaining portion of clock generator 10 to be subsequently described and for buffering Schmitt trigger 30 from the capacitance present in clock generator 10. Transistor 44 may comprise, for example, enhancement type MOSFETs. Transistor 42 may comprise, for example, a natural type MOSFET of low enhancement where $V_T$ equals zero volts.

Node 18 is interconnected to the drain of a transistor 54. The gate of transistor 54 is interconnected to the drain of a transistor 56 forming a node 58 therebetween. The source of transistor 56 is connected to node 46, and the gate of transistor 56 is connected to power terminal 12. Clock generator 10 further includes transistors 60 and 62 interconnected in series between power terminal 12 and power terminal 14. The drain of transistor 60 is connected to power terminal 12. The gate of transistor 60 is connected to the source of transistor 54, forming a node 64. The source of transistor 60 is connected to the drain of transistor 62 thereby forming a node 66. The gate of transistor 62 is connected to node 46, and the source of transistor 62 is connected to power terminal 14. Interconnected between nodes 64 and 66 is a MOS capacitor 68 wherein the gate is connected to node 64 and the source and drain terminals of capacitor 68 are connected to node 66. Transistors 60 and 62 comprise enhancement type MOSFETs. MOS capacitor 68 may be utilized, for example, with a depletion implant wherein $V_T$ equals minus three volts.

Interconnected in series between power terminal 12 and power terminal 14 are transistors 70 and 72 forming a node 74 therebetween. The gate of transistor 70 is connected to power terminal 12, and the drain of transistor 70 is connected to node 64. The source of transistor 72 is connected to power terminal 14. The gate of transistor 72 is connected to receive via a node 75 a reset signal from a reset terminal 76. Also interconnected between power terminal 12 and power terminal 14 are transistors 78 and 80 forming a node 82 therebetween. The gate of transistors 78 is connected to node 64. The drain of transistor 78 is connected to power terminal 12. The gate of transistor 80 is connected to node 46. The source terminal of transistor 80 is connected to power terminal 14. The output signal of clock generator 10 is produced at node 82 for application to an output terminal 86. Transistors 70, 72, 78 and 80 may comprise, for example, enhancement type MOSFETs.

The reset signal from terminal 76 is also applied via node 75 to the gate of a transistor 88. The drain of transistor 88 is connected to node 82. The source of transistor 88 is connected to power terminal 14. Transistor 88 may comprise, for example, an enhancement type MOSFET.

Transistors 70, 72 and 88 are not a necessary part of clock generator 10, but are utilized if it is desired that clock generator 10 be reset at a time different than the reset of the input to clock generator 10 as will subsequently be described.

Figure 2:
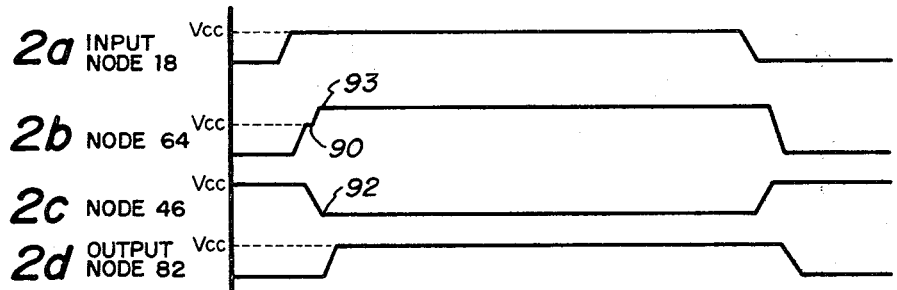
FIG. 2 illustrates signal waveforms illustrating the operation of the present clock generator.

The operation of clock generator 10 may best be understood by referring simultaneously to FIGS. 1 and 2. FIG. 2 illustrates the voltage levels of the input signal, node 18, (FIG. 2a), the output signal, node 82, (FIG. 2d), the voltage level of node 64 (FIG. 2b) and the voltage level of node 46 (FIG. 2c). Clock generator 10 provides a delay and buffer, such that as the input to clock generator 10 goes high, after a predetermined amount of delay, the output of clock generator 10 at node 82 will go high. As the input to clock generator 10 goes high at node 18, node 64 is precharged through transistor 54. Simultaneously, Schmitt trigger 30 guarantees that a high level has been achieved on node 64 (reference numeral 90, FIG. 2b) and after a delay forces node 46 low (reference numeral 92, FIG. 2c) allowing the voltage at nodes 82 and 66 to begin rising. Thereafter node 64 is bootstrapped by the action of capacitor 68 to a level above the input voltage (reference numeral 93, FIG. 2b), for example, if an 80 percent bootstrap was utilized, and the input voltage was five volts, node 64 would increase to nine volts. This voltage at node 64 allows transistor 78 to turn on hard to generate the output at node 82 of five volts.

Referring again to FIG. 1, the operation of Schmitt trigger 30 is such that when the input to clock generator 10 via input terminal 16 is zero, transistors 22 and 24 are cutoff such that transistor 20 pulls node 26 to the voltage level of $V_{cc}$ and transistor 40 pulls node 28 to a voltage level of $V_{cc}$ less one threshold. As the input on input terminal 16 begins to go high, transistor 24 turns on while transistor 22 still remains cutoff. As transistor 24 comes on, a resistor divider network is formed between transistor 40 and 24 to set the voltage at node 28. Since the gate of transistor 40 is at a voltage level of $V_{cc}$ and the gate of transistor 24 is at the input voltage which is now rising, transistors 40 and 24 set the source voltage of transistor 22 such that Schmitt trigger 30 will not switch until the input voltage rises above the voltage level of node 28 plus one threshold. The switching level is set for Schmitt trigger 30 such that when the rising edge of the input signal to clock generator 10 goes from zero to a high, transistor 22 will switch with the generation of one volt provided by the resistor divider network of transistors 40 and 24.

After transistors 22 and 24 have been pulled to $V_{cc}$ and are hard on, node 26 is pulled close to zero volts which then causes cutoff of transistor 40, such that node 28 will also be at zero volts. As the input voltage decreases, nodes 26 and 28 are at zero volts and Schmitt trigger 30 will switch at a voltage level of less than a threshold to cutoff transistors 22 and 24 allowing node 26 to go to the level of $V_{cc}$ and node 28 to follow.

The push-pull buffer circuit 50 comprising transistors 42 and 44 does not influence the operation of Schmitt trigger 30 since transistor 44 is always cutoff when transistor 22 is cutoff. Transistor 44 is not turned on until transistor 22 is turned on since their respective gate terminals and source terminals are respectively interconnected. Buffer 50, therefore, does not change the trigger point of Schmitt trigger 30. Buffer 50 allows transistor 20 to be fabricated very small such that a minimal value of current is dissipated when clock generator 10 is active since transistor 20 must only drive transistors 40 and 42.

Clock generator 10 is reset naturally by node 64 discharging through transistor 54 and node 46 going high as illustrated in FIGS. 2b and 2c. The output at node 82 cannot go low until node 46 goes high. As node 46 (FIG. 2c) goes high, node 58 goes high such that node 64 can go low. Since node 58 must go high before node 64 goes low, there is a delay between node 46 going high and node 64 going low.

Figure 3:
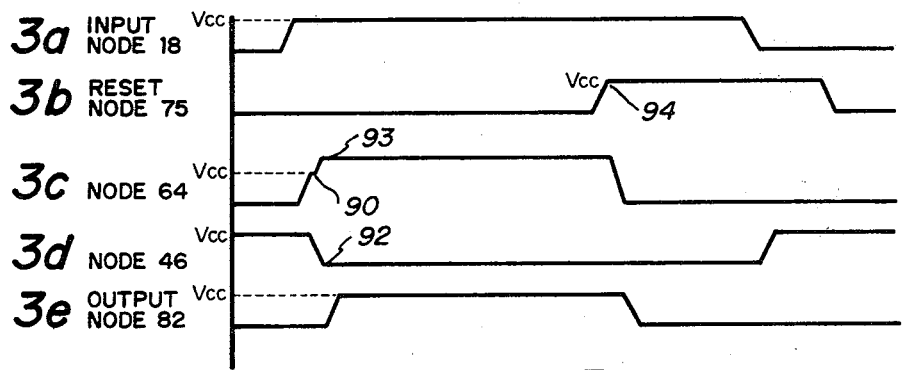
FIG. 3 illustrates signal waveforms illustrating the operation of the present clock generator.

Clock generator 10 can also be reset without using the natural discharge of node 64 through transistor 54. The waveforms illustrating the operation of clock generator 10 for resetting the output voltage at node 82 for application to output terminal 86 is shown in FIG. 3. FIG. 3b illustrates the reset voltage (reference numeral 94) applied at node 75 while the input voltage shown in FIG. 3a is high. The reset signal is applied to transistors 88 and 72 which causes nodes 64 and 82 to discharge as shown in FIGS. 3c and 3e.

It therefore can be seen that the present clock generator 10 using Schmitt trigger 30 has improved response times while being independent of the input signal slew rate and input voltage patterns. The clock generator of the present invention achieves a fast reset time either by natural discharge or utilizing a reset signal. Furthermore, no precharge clock signal is necessary for the operation of the present clock generator. The use of buffer 50 prevents capacitive loading on Schmitt trigger 30 such that Schmitt trigger 30 can properly trigger, being pattern insensitive to the input voltage applied to clock generator 10. Without the use of buffer 50, the capacitive loading due to the Miller capacitance of transistors 62 and 80 on Schmitt trigger 30 would not allow Schmitt trigger 30 to trigger in response to a rapidly changing pattern on the input to clock generator 10.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A delay stage which receives an input signal at an input terminal, produces an output signal at an output terminal and is powered through first and second power terminals, comprising:

Schmitt trigger means connected between the first and second power terminals and to the input terminal for receiving the input signal and for generating a detection signal upon detecting a predetermined level of the input signal, wherein said Schmitt trigger means comprises;

first, second and third transistors each having drain, source and gate terminals and being connected in series between the first power terminal and the second power terminal and forming a first node between said first and second transistors and a second node between said second and third transistors, said gate terminals of said second and third transistors being connected to the input terminal;

a fourth transistor having drain and source terminals connected between the first power terminal and said second node and a gate terminal thereof connected to said first node; and buffer means connected between the first power terminal and the Schmitt trigger means for receiving said detection signal and for generating the output signal at the output terminal without capacitively loading said Schmitt trigger means; wherein said buffer means comprises fifth and sixth transistors each having drain, source and gate terminals and being connected in series between the first power terminal and said second node and forming a third node therebetween, said gate terminal of said fifth transistor connected to said first node, and said third node forming the output terminal and said gate terminal of said sixth transistor being connected to the input terminal.

2. A delay stage which receives an input signal at an input terminal, produces an output signal at an output terminal and is powered through first and second power terminals, comprising:

first, second and third transistors each having drain, source and gate terminals and being connected in series between the first power terminal and the second power terminal and forming a first node between said first and second transistors and a second node between said second and third transistors;

a fourth transistor having drain, source and gate terminals connected between the first power terminal and said second node, said gate terminal thereof connected to said first node;

fifth and sixth transistors each having drain, source and gate terminals and being connected in series between the first power terminal and said second node, and forming a third node therebetween, said gate terminal of said fifth transistor connected to said first node, and said third node forming the output terminal; and said gate terminal of said second transistor, said gate terminal of said third transistor and said gate terminal of said sixth transistor being connected to the input terminal.

3. The delay stage of claim 2 wherein said first transistor comprises a depletion type MOSFET.

4. The delay stage of claim 2 wherein said first transistor comprises a saturated enhancement type MOSFET, said gate terminal thereof being connected to the first power terminal.

5. The delay stage of claim 2 wherein said second, third, fourth and sixth transistors comprise enhancement type MOSFETs.

6. The delay stage of claim 2 wherein said fifth transistor comprises a MOSFET having a threshold voltage of approximately zero volts.

7. The delay stage of claim 2 wherein said first, second, third and fourth transistors comprise a Schmitt trigger stage and said fifth and sixth transistors comprise a push-pull inverter stage to prevent capacitive loading of said Schmitt trigger stage.

8. A delay stage which receives an input signal at an input terminal and is powered through first and second power terminals, comprising:

a first transistor having drain, source and gate terminals, the drain terminal thereof connected to the first power terminal;

a second transistor having drain, source and gate terminals, said drain terminal thereof connected to said source and gate terminals of said first transistor thereby forming a first node, said gate terminal thereof connected to the input terminal;

a third transistor having drain, source and gate terminals, said drain terminal thereof connected to said source terminal of said second transistor thereby forming a second node, said gate terminal thereof connected to the input terminal, and said source terminal thereof connected to the second power terminal;

a fourth transistor having drain, source and gate terminals, said drain terminal thereof connected to the first power terminal, said gate terminal thereof connected to said first node, and said source terminal thereof connected to said second node;

a fifth transistor having drain, source and gate terminals, said drain terminal thereof connected to the first power terminal, and said gate terminal thereof connected to said first node; and a sixth transistor having drain, source and gate terminals, said drain terminal thereof connected to said source terminal of said fifth transistor, said gate terminal thereof connected to the input terminal, and said source terminal thereof connected to said second node.

9. The delay stage of claim 8 wherein said first transistor comprises a depletion type MOSFET.

10. The delay stage of claim 8 wherein said first transistor comprises a saturated enhancement type MOSFET, said gate terminal thereof being connected to the first power terminal.

11. The delay stage of claim 8 wherein said second, third, fourth and sixth transistors comprise enhancement type MOSFETs.

12. The delay stage of claim 8 wherein said fifth transistor comprises a MOSFET having a threshold voltage of approximately zero volts.

13. The delay stage of claim 8 wherein said first, second, third and fourth transistors comprise a Schmitt trigger stage and said fifth and sixth transistors comprise a push-pull inverter stage to prevent capacitive loading of said Schmitt trigger stage.

14. A clock generator circuit for producing clocking signals wherein the clock generator circuit receives an input signal at an input terminal, produces an output signal at an output terminal and is powered through first and second power terminals, comprising:

Schmitt trigger means connected between the first and second power terminals and to the input terminal for receiving the input signal and for generating a detection signal upon detecting a predetermined level of the input signal;

buffer means connected between the first power terminal and the Schmitt trigger means for receiving said detection signal;

a first transistor having drain, source and gate terminals, said drain terminal thereof connected to the input terminal;

a second transistor having drain, source and gate terminals, said drain terminal thereof connected to said gate terminal of said first transistor, said gate terminal thereof connected to the first power terminal and said source terminal thereof connected to said buffer means;

third and fourth transistors each having drain, source and gate terminals and being connected in series between the first power terminal and the second power terminal and forming a first node therebetween, said gate terminal of said third transistor being connected to said source terminal of said first transistor and said gate terminal of said fourth transistor being connected to said source terminal of said second transistor;

capacitor means connected between said source terminal of said first transistor and said first node; and fifth and sixth transistors each having drain, source and gate terminals and being connected in series between the first power terminal and the second power terminal and forming the output terminal therebetween, said gate terminal of said fifth transistor connected to said gate terminal of said third transistor and said gate terminal of said sixth transistor connected to said gate terminal of said fourth transistor.

15. The clock generator circuit of claim 14 wherein said buffer means comprises push-pull inverter means.

16. The clock generator circuit of claim 14 wherein said Schmitt trigger means comprises:

seventh, eighth and ninth transistors each having drain, source and gate terminals and being connected in series between the first power terminal and the second power terminal and forming a second node between said seventh and eighth transistors and a third node between said eighth and ninth transistors; and a tenth transistor having drain, source and gate terminals connected between the first power terminal and said third node and said gate terminal thereof connected to said second node.

17. The clock generator circuit of claim 16 wherein said buffer means comprises:

eleventh and twelfth transistors each having drain, source and gate terminals and being connected in series between the first power terminal and said third node and forming a fourth node therebetween, said gate terminal of said eleventh transistor connected to said second node, said gate terminal of said twelfth transistor being connected to the input terminal; and said fourth node being connected to said source terminal of said second transistor and to said gate terminals of said fourth and sixth transistors.

18. A clock generator circuit for producing clocking signals which receives an input signal at an input terminal, produces an output signal at an output terminal and is powered through first and second power terminals, comprising:

first, second and third transistors each having drain, source and gate terminals and being connected in series between the first power terminal and the second power terminal and forming a first node between said first and second transistors and a second node between said second and third transistors;

a fourth transistor having drain, source and gate terminals connected between the first power terminal and said second node, said gate terminal thereof connected to said first node;

fifth and sixth transistors each having drain, source and gate terminals and being connected in series between the first power terminal and said second node, and forming a third node therebetween, said gate terminal of said fifth transistor connected to said first node;

said gate terminal of said second transistor, said gate terminal of said third transistor and said gate terminal of said sixth transistor being connected to the input terminal;

a seventh transistor having drain, source and gate terminals, said drain terminal thereof connected to the input terminal;

an eighth transistor having drain, source and gate terminals, said drain terminal thereof connected to said gate terminal of said seventh transistor, said gate terminal thereof connected to the first power terminal and said source terminal thereof connected to said third node;

ninth and tenth transistors each having drain, source and gate terminals and being connected in series between the first power terminal and the second power terminal and forming a fourth node therebetween, said gate terminal of said ninth transistor being connected to said source terminal of said seventh transistor and said gate terminal of said tenth transistor being connected to said source terminal of said eighth transistor;

capacitor means connected between said source terminal of said seventh transistor and said fourth node; and eleventh and twelfth transistors each having drain, source and gate terminals and being connected in series between the first power terminal and the second power terminal and forming the output terminal therebetween, said gate terminal of said eleventh transistor connected to said gate terminal of said ninth transistor and said gate terminal of said twelfth transistor connected to said gate terminal of said tenth transistor.

19. The clock generator circuit of claim 18 wherein said first transistor comprises a depletion type MOSFET.

20. The clock generator circuit of claim 18 wherein said first transistor comprises a saturated enhancement type MOSFET, said gate terminal thereof being connected to the first power terminal.

21. The clock generator circuit of claim 18 wherein said second, third, fourth and sixth transistors comprise enhancement type MOSFETs.

22. The clock generator circuit of claim 18 wherein said fifth transistor comprises a MOSFET having a threshold voltage of approximately zero volts.

23. The clock generator circuit of claim 18 wherein said first, second, third and fourth transistors comprise a Schmitt trigger stage and said fifth and sixth transistors comprise a push-pull inverter stage to prevent capacitive loading of said Schmitt trigger stage.

24. The clock generator of claim 18 and further including reset means.

25. The clock generator of claim 24 wherein said reset means includes:

thirteenth and fourteenth transistors each having drain, source and gate terminals, said gate terminal of said thirteenth transistor connected to the first power terminal, said drain terminal of said thirteenth transistor connected to said gate terminal of said ninth transistor, said source terminal of said thirteenth transistor connected to said drain terminal of said fourteenth transistor, said source terminal of said fourteenth transistor connected to the second power terminal, and said gate terminal of said fourteenth transistor forming a reset terminal; and a fifteenth transistor having drain, source and gate terminals, said drain terminal connected to the output terminal, said source terminal thereof connected to the second power terminal and said gate terminal thereof connected to said reset terminal.

* * * * *